United States Patent
Moon

(10) Patent No.: US 11,914,170 B2
(45) Date of Patent: Feb. 27, 2024

(54) APPARATUS FOR PROVIDING BIAS CURRENT TO HALL SENSOR

(71) Applicant: Samsung Electro-Mechanics Co., Ltd., Suwon-si (KR)

(72) Inventor: Yo Sub Moon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 559 days.

(21) Appl. No.: 17/022,519

(22) Filed: Sep. 16, 2020

(65) Prior Publication Data
US 2021/0397015 A1 Dec. 23, 2021

(30) Foreign Application Priority Data
Jun. 17, 2020 (KR) .................. 10-2020-0073543

(51) Int. Cl.
| | | |
|---|---|---|
| G01B 7/14 | (2006.01) | |
| G01B 7/30 | (2006.01) | |
| G01R 33/06 | (2006.01) | |
| H01L 43/06 | (2006.01) | |
| G02B 27/64 | (2006.01) | |
| G01D 5/14 | (2006.01) | |
| G01R 33/00 | (2006.01) | |
| G01D 11/24 | (2006.01) | |
| G01R 33/07 | (2006.01) | |

(52) U.S. Cl.
CPC .......... *G02B 27/646* (2013.01); *G01D 5/142* (2013.01); *G01D 5/145* (2013.01); *G01D 5/147* (2013.01); *G01D 11/245* (2013.01); *G01R 33/0041* (2013.01); *G01R 33/0082* (2013.01); *G01R 33/07* (2013.01); *G01R 33/072* (2013.01); *G01R 33/077* (2013.01); *G03B 2205/0007* (2013.01); *G03B 2217/005* (2013.01)

(58) Field of Classification Search
CPC ........ G02B 27/646; G02B 7/02; G01D 5/142; G01D 5/145; G01D 5/147; G01D 11/245; G01R 33/0041; G01R 33/0082; G01R 33/072; G01R 33/0023; G01R 33/07; G01R 33/077; G03B 2205/0007; G03B 2217/005; G03B 5/00; G01B 7/003
USPC ........ 324/51, 55, 200, 207.11, 207.13, 207.2
See application file for complete search history.

(56) References Cited

U.S. PATENT DOCUMENTS

| | | | |
|---|---|---|---|
| 2011/0316528 A1* | 12/2011 | Matsumoto | G03B 5/00 324/207.14 |
| 2014/0333295 A1* | 11/2014 | Fernandez | G01R 33/0023 324/207.12 |
| 2016/0377690 A1 | 12/2016 | Huber et al. | |
| 2017/0242709 A1* | 8/2017 | Bodner | G06F 1/3287 |
| 2019/0107584 A1* | 4/2019 | Baorda | G01R 33/0041 |

(Continued)

FOREIGN PATENT DOCUMENTS

| | | | | |
|---|---|---|---|---|
| EP | 2784521 | * | 1/2014 | G01R 17/16 |
| JP | 3797149 B2 | | 7/2006 | |
| KR | 10-1918108 B1 | | 1/2019 | |

*Primary Examiner* — Raul J Rios Russo
(74) *Attorney, Agent, or Firm* — NSIP Law

(57) ABSTRACT

An apparatus for providing a bias current to a hall sensor includes: a bias provider configured to provide the bias current to the hall sensor; and a processor configured to produce a bias current control value based on a node voltage between the hall sensor and the bias provider, wherein the bias provider is configured to vary the bias current based on the bias current control value.

15 Claims, 9 Drawing Sheets

(56) References Cited

U.S. PATENT DOCUMENTS

| | | | |
|---|---|---|---|
| 2019/0377053 A1* | 12/2019 | Peev | G01D 5/24457 |
| 2020/0341076 A1* | 10/2020 | Giterman | G01D 5/147 |
| 2021/0173019 A1* | 6/2021 | Heo | G01P 1/006 |

* cited by examiner

APPARATUS FOR PROVIDING BIAS CURRENT TO HALL SENSOR

CROSS-REFERENCE TO RELATED APPLICATIONS

This application claims the benefit under 35 U.S.C. § 119(a) of Korean Patent Application No. 10-2020-0073543 filed on Jun. 17, 2020 in the Korean Intellectual Property Office, the entire disclosure of which is incorporated herein by reference for all purposes.

BACKGROUND

1. Field

The following description relates to an apparatus for providing a bias current to a hall sensor.

2. Description of Related Art

In general, a technique for fixing a relative position of a lens module externally when the lens module moves according to force received from an external source is widely used.

For example, an optical image stabilizer (OIS) can be configured to fix a position of a lens module inside the camera module, even when external force is applied to the camera module.

A hall sensor can be used to measure position information of a lens module and can output a voltage varying depending on the position of the lens module. Accuracy of the OIS may increase as accuracy of correspondence between an output voltage of the hall sensor and position information of the lens module increases.

Since the output voltage of the hall sensor may change slightly according to a temperature of the hall sensor, and a variation of the output voltage according to the temperature of the hall sensor is substantially independent of the position of the lens module, the hall sensor temperature variations may reduce the accuracy of the correspondence between the output voltage of the hall sensor and the position information of the lens module.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an apparatus for providing a bias current to a hall sensor includes: a bias provider configured to provide the bias current to the hall sensor; and a processor configured to produce a bias current control value based on a node voltage between the hall sensor and the bias provider, wherein the bias provider is configured to vary the bias current based on the bias current control value.

The processor may be further configured to provide a hall sensor output value, corresponding to a voltage difference between first and second output terminals of the hall sensor, to a driver configured to control driving of a lens module.

The apparatus may further include an AD converter configured to: convert a first analog value, corresponding to the node voltage between the hall sensor and the bias provider, to a first digital value; and convert a second analog value, corresponding to the voltage difference between the first and second output terminals of the hall sensor, to a second digital value.

The apparatus may further include an amplifier configured to amplify the voltage difference between the first and second output terminals of the hall sensor. The second analog value may correspond to an amplified voltage produced by the amplifier.

The apparatus may further include: an AD converter configured to convert a first analog value corresponding to the node voltage between the hall sensor and the bias provider to a first digital value; and a switch configured to switch an electrical connection between the bias provider and a terminal of the AD converter into which the first analog value is input on and off.

The apparatus may further include a filter configured to filter a frequency component having a frequency higher than a cut-off frequency in the node voltage between the hall sensor and the bias provider The bias provider may include: a first bias provider configured to produce a variable first bias current based on the bias current control value; and a second bias provider configured to produce a second bias current less relevant to the bias current control value than the first bias current. The first and second bias currents may be provided in the hall sensor together.

The first bias provider may include: first and second resistors electrically connected to each other; and an intermediate transistor configured to output a current dependent on the first bias current to the first and second resistors. The second resistor may have a variable resistance value that varies depending on the bias current control value.

The first bias provider may further include an operational amplifier configured to be input with a voltage corresponding to the bias current, output an amplified voltage to the intermediate transistor, and receive feedback from a node between the first and second resistors.

The first bias provider may further include a first transistor configured to be input with the amplified voltage output by the operational amplifier and produce the first bias current. The second bias provider may include a second transistor configured to be input with a reference voltage from a voltage source and produce the second bias current.

The bias provider may include: a first transistor configured to produce a first bias current; and a second transistor configured to produce a second bias current. The first and second bias currents may be provided together to the hall sensor. The second transistor may be configured to be input, from a voltage source, with a voltage varying based on the bias current control value and produce the second bias current based on the varying voltage.

The processor may be further configured to receive a hall sensor output value corresponding to a voltage difference of first and second output terminals of the hall sensor, and produce a compensating output value by compensating for the hall sensor output value based on the node voltage between the hall sensor and the bias provider.

In another general aspect, an apparatus for providing a bias current to a hall sensor includes: a bias provider configured to provide the bias current to the hall sensor; and an AD converter. The AD converter is configured to: convert a first analog value, corresponding to the node voltage between the hall sensor and the bias provider, to a first digital value; and convert a second analog value, corresponding to a voltage difference between first and second output terminals of the hall sensor, to a second digital value. The apparatus includes a processor configured to compensate for the second digital value based on the first digital value to produce a compensating output value.

The processor may be further configured to apply the first digital value as a coefficient of the second digital value to produce the compensating output value.

The apparatus may further include: a switch configured to switch an electrical connection between the bias provider and a terminal of the AD converter into which the first analog value is input on and off; and a filter configured to filter a frequency component having a frequency higher than a cut-off frequency in the node voltage between the hall sensor and the bias provider.

The processor may be further configured to provide the compensating output value to a driver configured to control driving of a lens module.

In another general aspect, a camera module includes: a lens module; a hall sensor configured to measure position information of the lens module; a driver electrically connected to the hall sensor and configured to control driving of the lens module; and a bias provider configured to provide a bias current to the hall sensor, and vary the bias current based on a node voltage between the hall sensor and the bias provider.

The camera module may further include a processor configured to produce a bias current control value based on the node voltage. The bias provider may be further configured to vary the bias current based on the bias current control value.

The processor may be further configured to provide a hall sensor output value, corresponding to a voltage difference between first and second output terminals of the hall sensor, to the driver.

The processor may be further configured to receive a hall sensor output value corresponding to a voltage difference of first and second output terminals of the hall sensor, and provide a compensating output value to the driver by compensating for the hall sensor output value based on the node voltage.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1A:
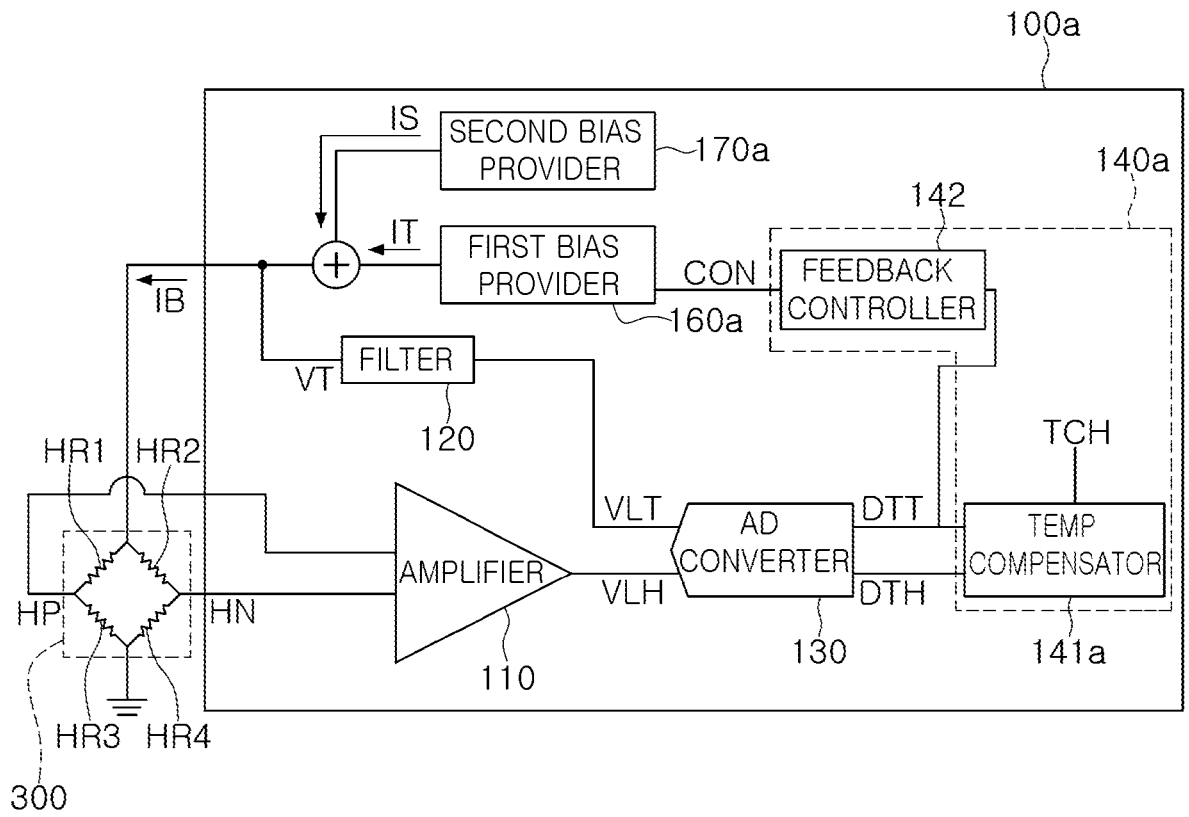
FIGS. 1A and 1B are diagrams illustrating apparatuses for providing a bias current to a hall sensor, according to embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 1B:
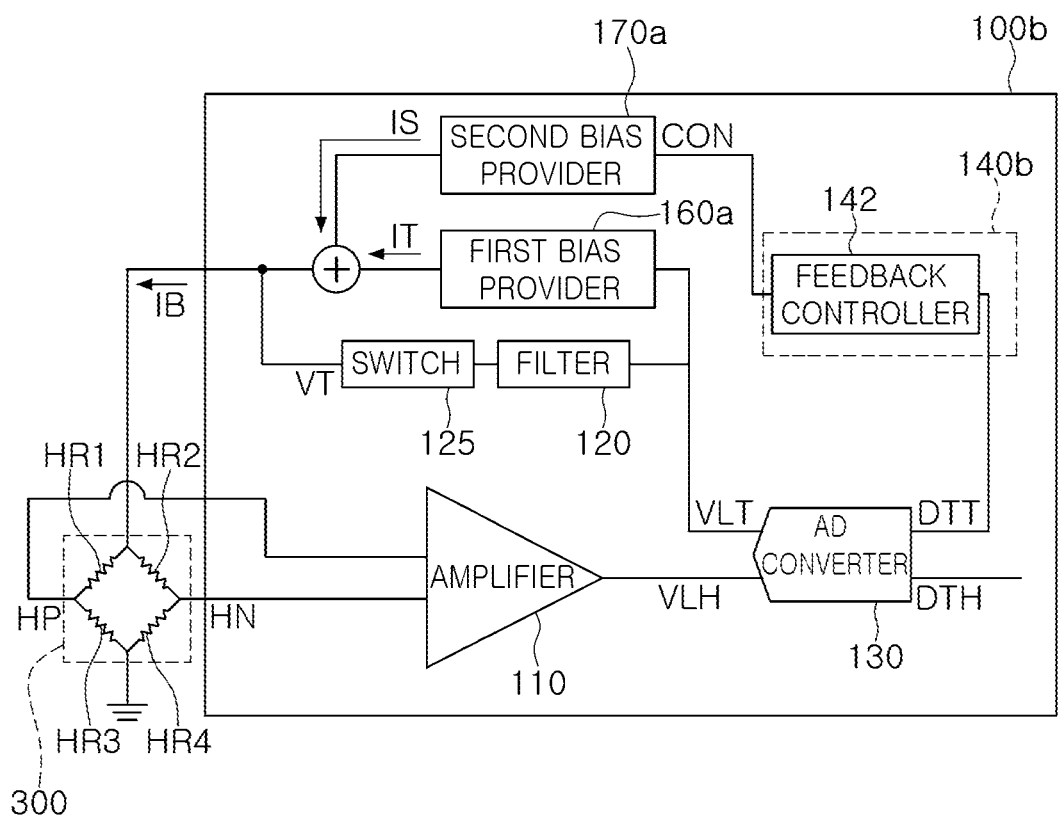

FIGS. 1A and 1B are diagrams illustrating an apparatus 100a for providing a bias current to a hall sensor, according to an embodiment. For example, the apparatus 100a may be provided in a camera module, and a hall sensor 300 may be configured to measure position information of a lens module.

Referring to FIG. 1A, the apparatus 100a includes, for example, a bias provider including at least one of a first bias provider 160a and a second bias provider 170a, and a processor 140a.

For example, the apparatus 100a may be implemented as an integrated circuit (IC) and may be mounted on a board such as a printed circuit board. The apparatus 100a may be electrically connected to the hall sensor 300 through the board.

The bias provider may provide a bias current IB to the hall sensor 300. For example, the bias provider may be configured to provide a first bias current IT of the first bias provider 160a and a second bias current IS of the second bias provider 170a to the hall sensor 300.

An equivalent circuit of the hall sensor 300 may include first, second, third and fourth sensor resistance HR1, HR2, HR3 and HR4. The bias current IB may flow through the first to fourth sensor resistances HR1 to HR4. Specific structures of the first to fourth sensor resistances HR1 to HR4 are not limited to equivalent circuits and may be embodied in various ways.

The hall sensor 300 may detect magnetic flux passing through the hall sensor 300 using a hall effect. When magnetic flux passes through the hall sensor 300, the hall sensor 300 may produce a hall voltage in a direction perpendicular to the magnetic flux and the bias current IB, and a voltage difference between the first and second hall sensor output terminals HP and HN may be used as a value measured with respect to the magnetic flux passing through the hall sensor 300.

Resistance values of the first to fourth hall sensor resistances HR1 to HR4 may vary depending on a temperature of the hall sensor. The voltage difference between the first and second hall sensor output terminals HP and HN with respect to a unit magnetic flux passing through the hall sensor 300 increases as resistance values of the first to fourth hall sensor resistances HR1 to HR4 increase.

That is, when the temperature of the hall sensor 300 varies, the voltage difference between the first and second hall sensor output terminals HP and HN with respect to a unit magnetic flux passing through the hall sensor 300 may vary. The voltage difference between the first and second hall sensor output terminals HP and HN may be determined by the temperature of the hall sensor 300 and the magnetic flux passing through the hall sensor 300.

Accordingly, in an aspect that information of magnetic flux passing through the hall sensor is extracted from the voltage difference between the first and second hall sensor output terminals HP and HN, an effect of the varying temperature of the hall sensor 300 may be understood as a portion of the information of magnetic flux passing through the hall sensor 300. That is, an accuracy of the extracted information of magnetic flux may be lowered.

The apparatus 100a may be configured such that the bias current IB varies in a direction opposite to a direction of the effect of the voltage difference between the first and second hall sensor output terminals HP and HN, in accordance with the varying temperature of the hall sensor 300.

For example, when the resistance value of the first to fourth hall sensor resistance HR1 to HR4 increases or decreases as the temperature varies, a node voltage between the first and second hall sensor resistances HR1 and HR2 may increase or decrease based on an assumption that the node between the third and fourth hall sensor resistances HR3 and HR4 is connected to a ground.

That is, a node voltage VT between the first and second hall sensor resistance HR1 and HR2 may vary as the temperature of the hall sensor 300 varies and may be dependent of the bias current IB.

The processor 140a may produce a bias current control value CON based on the node voltage VT between the hall sensor 300 and the first bias provider 160a.

The bias provider or the first bias provider 160a may be configured such that the bias current IB provided to the hall sensor 300 based on the bias current control value CON varies.

In this regard, the apparatus 100a can significantly reduce an effect of temperature element, among elements determining the voltage difference between the first and second hall sensor output terminals HP and HN and improve the accuracy of the magnetic flux information based on the output voltage of the hall sensor 300.

Further, the apparatus 100a may have a structure in which a beginning and an end of a process of reducing an effect of the elements dependent of the temperature of the output voltage of the hall sensor utilize a bias current, thereby improving at least one of efficiency, accuracy and stability of the process.

Referring to FIG. 1A, the apparatus 100a may further include an amplifier 110 configured to amplify a voltage of an output terminal of the hall sensor 300.

For example, the amplifier 110 may be implemented as a (non-) reversible amplifier circuit, in which an operational amplifier and a plurality of resistance elements (e.g., resistors) are combined, and may produce a voltage VLH amplified proportionally to the voltage difference between the first and second hall sensor output terminals HP and HN. The amplified voltage VLH may correspond to the voltage difference between the first and second hall sensor output terminals HP and HN.

A gain of the amplifier 110 may be determined according to a relation of resistance values of a plurality of the resistance elements. It may be advantageous for the amplifier 110 to have a low gain in a case in which a broad range of detection of the magnetic flux of the hall sensor 300 is required, while it may be advantageous for the amplifier 110 to have a high gain in a case in which a high resolution for detecting the magnetic flux of the hall sensor 300 is required.

Referring to FIG. 1A, the apparatus 100a may further include an AD converter 130.

The AD converter 130 may convert a first analog value VLT corresponding to the node voltage VT between the hall sensor 300 and the first bias provider 160a to a first digital value DTT and a second analog value corresponding to the voltage difference between the first and second output terminals of the hall sensor HP and HN to a second digital value corresponding to a hall sensor output value DTH. For example, the second analog value may be the voltage VLH.

The AD converter 130 may have a plurality of AD converting channels. For example, a first AD converting channel is a channel into/from which the first analog value VLT and the first digital value DTT are input and output, respectively, and a second AD converting channel is a channel into/from which the second analog value and the second digital value are input and output, respectively. For example, the AD converter 130 may have a structure in which a plurality of analog-digital converter circuits are disposed to be parallel to each other, and the plurality of the analog-digital converter circuits may correspond to the plurality of AD converting channels.

Referring to FIG. 1A, the apparatus 100a may further include a filter 120 configured to filter a frequency component having a frequency higher than a cut-off frequency in the node voltage between the hall sensor and the bias provider. Thus, the apparatus 100a may reduce noises that may affect stability of a feedback structure of the bias provider or the first bias provider 160a, thereby improving varying stability of the bias current IB of the first bias provider 160a.

For example, the filter 120 may be an RC low pass filter in which one of a capacitor and resistance element (e.g., a resistor) is serially connected and the other thereof is shunted to be connected to a ground.

For example, the processor 140a may include either one or both of a temperature compensator 141a and a feedback controller 142. The feedback controller 142 may produce a bias current control CON value based on the first digital value DTT corresponding to the node voltage between the hall sensor 300 and the first bias provider 160a.

The temperature compensator 141a of the processor 140a is provided with the hall sensor output value DTH corresponding to the voltage difference between the first and second hall sensor output terminals HP and HN. The temperature compensator 141a may produce a compensating output value TCH by compensating the hall sensor output value DTH based on the first digital value DTT corresponding to the node voltage between the hall sensor 300 and the first bias provider 160a. Thus, an accuracy of the extracted information of magnetic flux may be further improved in the aspect that the information of magnetic flux passing through the hall sensor 300 is extracted from the voltage difference between the first and second hall sensor output terminals HP and HN.

For example, the apparatus 100a may be designed such that the bias current IB has a substantially fixed value without the feedback controller 142.

Referring to FIG. 1B, an apparatus 100b for providing a bias current to a hall sensor, according to example embodiment, may have a structure in which a temperature compensator is omitted from a processor 140b.

Further, the feedback controller 142 of the processor 140b may be configured to deliver the bias current control value CON to the second bias provider 170a.

Referring to FIG. 1B, the apparatus 100b may further include a switch 125 configured to switch an electrical connection between the node between the first and second hall sensor resistance HR1 and HR2 and a terminal of the AD converter 130 into which the first analog value VLT is input on and off.

For example, the switch 125 may electrically connect the node between the first and second hall sensor resistances HR1 and HR2 to the terminal of the AD converter 130, into which the first analog value VLT is input, for a predetermined period of time. For example, the switch 125 may include a switch transistor configured to have a control voltage input thereto through a gate terminal and switch an electrical connection between a source terminal and drain terminal on and off.

For example, the processor 140b may determine a variation of the voltage VT in accordance with a unit temperature variation based on a difference between the voltage VT when the switch 125 is in a first cycle and the voltage VT when the switch 125 is in a second cycle.

Specifically, for example, the processor 140b may determine a variation rate of the voltage VT in accordance with the unit temperature variation based on a trend of several voltages VT accumulated during a long-term cycle longer than the predetermined cycle. The processor 140b may be input with and store the variation rate of the voltage VT in accordance with the unit temperature variation in advance. The processor 140b may further calculate the resistance values of the first to fourth hall sensor resistance HR1 to HR4 based on the bias current IB and voltage VT and determine the variation rate of the voltage VT in accordance with the unit temperature variation based on the calculated resistance values. The processor 140b may also apply various bias current control values CON to the bias provider or the first bias provider 160a as the voltage VT varies and determine the variation rate of the voltage VT in accordance with the unit temperature variation through the variation of the voltage VT.

For example, the processor 140b may change the bias current control value CON of the second cycle by changing the bias control value CON of the first cycle in proportion to the voltage VT difference between when the switch 125 is in the first cycle and when the switch 125 is in the second cycle.

Figure 2A:
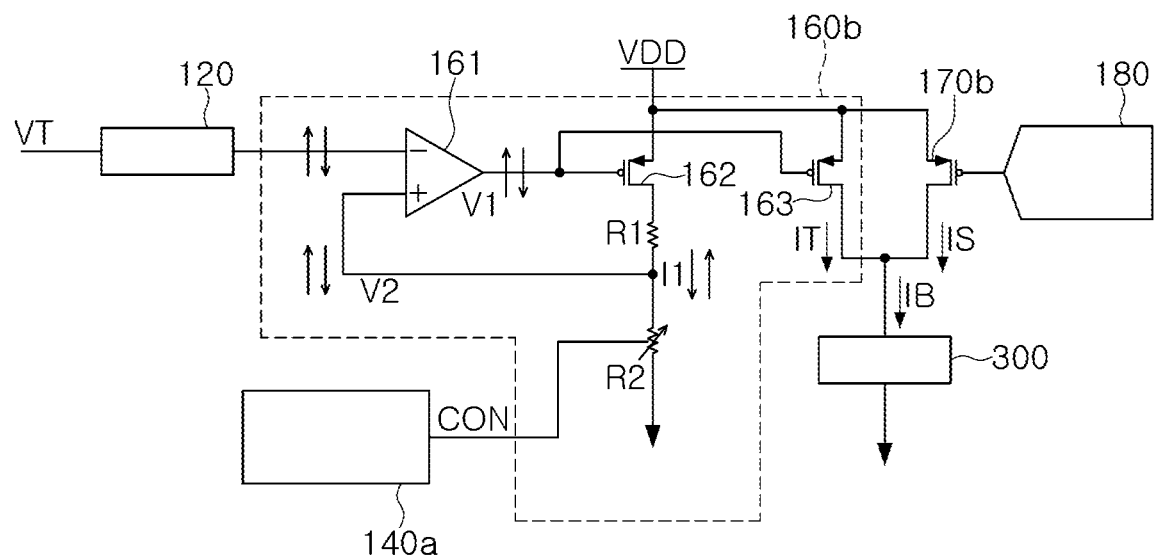
FIGS. 2A and 2B are circuit diagrams illustrating bias providers of apparatuses for providing a bias current to a hall sensor, according to embodiments.
Figure 2B:
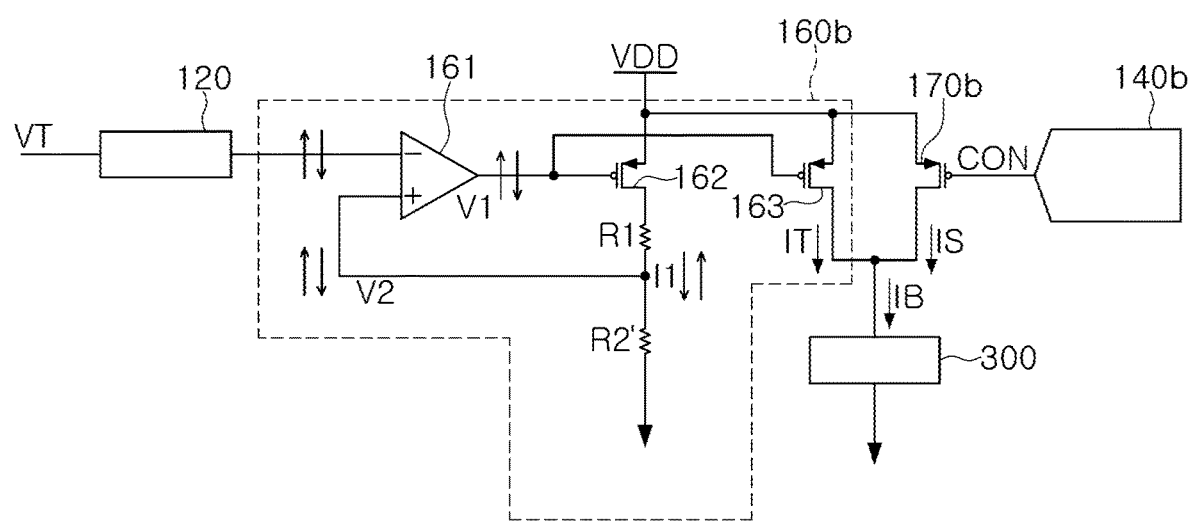

FIGS. 2A and 2B are circuit diagrams illustrating bias providers of antenna apparatuses 100c and 100d for providing a bias current to a hall sensor, according to embodiments.

Referring to FIG. 2A, the apparatus 100c for providing a bias current to a hall sensor includes, for example, a bias provider including at least one of a first bias provider 160b and a second bias provider 170b, and a processor 140a.

The first bias current IT produced by the first bias provider 160b may vary depending on the bias current control value CON, and the second bias current IS produced by the second bias provider 170b may be less relevant to the bias current control value CON, as compared to the first bias current IT.

The first bias current IT and the second bias current IS may be provided to the hall sensor 300 together.

The first bias provider 160b may include a first transistor 163 in which the first bias current IT flows between a drain terminal and a source terminal of the first transistor 163. The second bias provider 170b may include a second transistor in which the second bias current IS flows between a drain terminal and a source terminal of the second transistor.

The second transistor may have a reference voltage from a voltage source 180 input thereto through a gate terminal, and produce a second bias current IS based on the reference voltage. When the voltage provided by the voltage source 180 is substantially fixed, the second bias current IS may be less relevant to the bias current control value CON, as compared to the first bias current IT.

Referring to FIG. 2A, the first bias provider 160b may include a first resistor R1, a second resistor R2 and an intermediate transistor 162.

A voltage of a gate terminal of the intermediate transistor 162 may be shared with that of the first transistor 163. Accordingly, a current between a drain terminal and a source terminal of the intermediate transistor 162 may be dependent of the first bias current IT.

The first and second resistors R1 and R2 may be electrically connected to each other. The current between the drain terminal and the source terminal of the intermediate transistor 162 may flow the first and second resistors R1 and R2.

The second resistor R2 may have a variable resistance value that varies based on the bias current control value CON.

Assuming that a voltage V2 is almost fixed, the current of the intermediate transistor 162 may be reduced as the resistance value of the second resistor R2 increases. In this regard, a voltage difference between the source terminal and the gate terminal of the intermediate transistor 162 may be small. A voltage difference between the source terminal and the gate terminal of the first transistor 163 may decrease, and the first bias current IT may decrease. Accordingly, the bias current IB provided to the hall sensor 300 may decrease.

Referring to FIG. 2A, the first bias provider 160b may further include an operational amplifier 161 configured to have the voltage VT corresponding to the bias current IB input thereto, output an amplified voltage V1 to the intermediate transistor 162, and receive feedback from a node between the first and second resistors R1 and R2. The higher the gain of the operational amplifier 161, the smaller the difference between the voltage VT and the voltage V2. In the case in which the gain of the operational amplifier 161 goes to infinity, the voltages VT and V2 may be substantially the same.

Accordingly, a correlation of the node voltage V2 between the first and second resistors R1 and R2 to the hall sensor 300 may be high. The first bias provider 160b can produce the first bias current IT by combining at the voltage VT an element of a temperature of the resistance value of the second resistor R2 and an element of a temperature of the hall sensor 300.

Referring to FIG. 2B, the apparatus 100d for providing a bias current to a hall sensor may include the first bias provider 160b having a fixed resistance of a second resistor R2' and a second bias provider 170b in which a voltage input into the gate terminal varies.

For example, the processor 140b may provide an analogy value of the bias current control value CON to the gate terminal of the second transistor of the second bias provider 170b. The second bias current IS may be dependent on the bias current control value CON while the bias current IB provided to the hall sensor 300 may also be dependent on the bias current control value CON.

Figure 3:
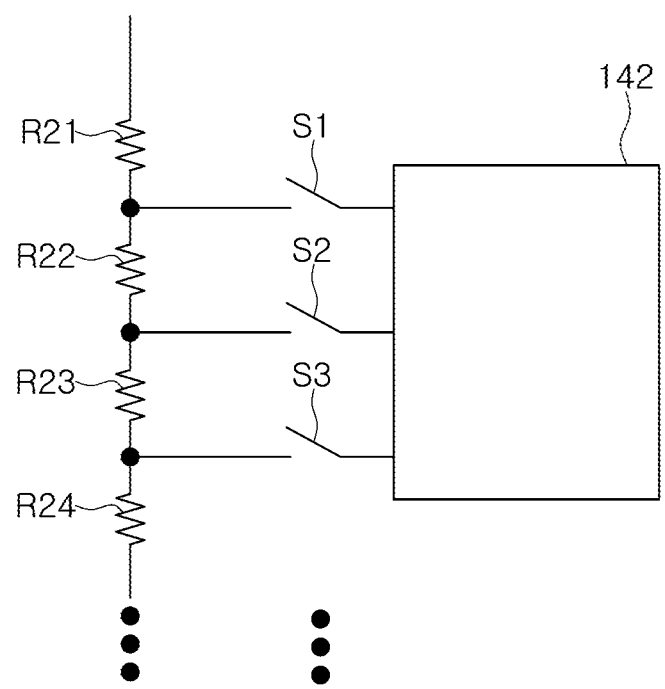
FIG. 3 is a diagram illustrating a portion (a feedback controller) of a processor of an apparatus for providing a bias current to a hall sensor, according to an embodiment.

FIG. 3 is a diagram illustrating a portion (the feedback controller 142) of a processor of an apparatus for providing a bias current to a hall sensor, according to an example.

Referring to FIG. 3, the feedback controller 142 may control the number of electrical connections of a plurality of switches S1, S2, and S3 based on a bias current control value.

A second resistor (e.g., the second resistor R2 in FIG. 2A) may include a plurality of second resistors R21, R22, R23, and R24, and may have a resistance value dependent of the number of the electrical connections of the plurality of switches S1, S2 and S3. Accordingly, a resistance of the second resistor R2 may be variable.

Figure 4:
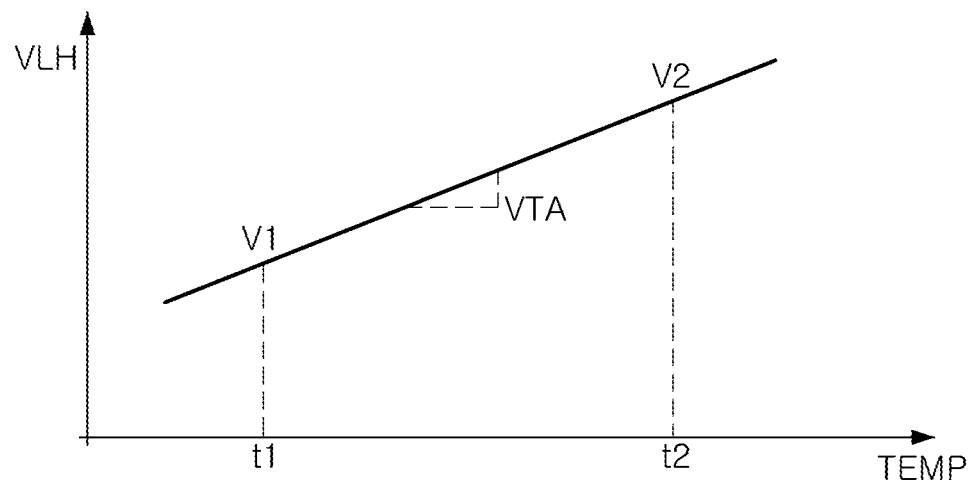
FIG. 4 is a diagram illustrating a change in a voltage difference between first and second hall sensor output terminals of a hall sensor over temperature.

FIG. 4 is a diagram illustrating a change in a voltage difference between first and second hall sensor output terminals of a hall sensor over temperature.

Referring to FIG. 4, the voltage VLH corresponding to a voltage difference between first and second hall sensor output terminals of a hall sensor may be V1 and V2 when a temperature TEMP is a first temperature t1 and a second temperature t2, respectively.

In this case, a rate of variation of a voltage VTA in accordance with a unit temperature variation may be dependent on the voltage VT illustrated in FIG. 1A and calculated by Formula 1 below:

$$VTA = \frac{V_{t2} - V_{t1}}{t_2 - t_1}. \qquad \text{Formula 1}$$

Figure 5:
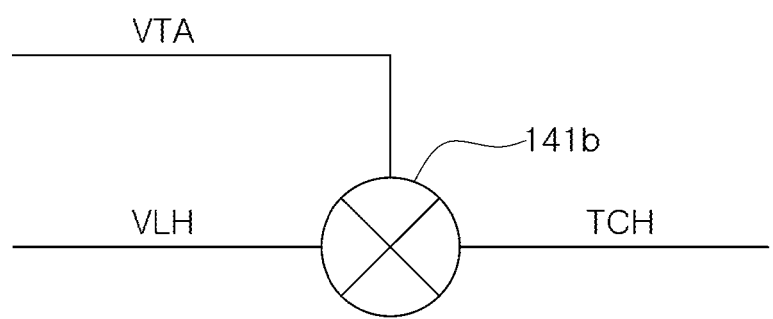
FIG. 5 is a diagram illustrating a portion (a temperature compensator) of a processor of an apparatus for providing a bias current to a hall sensor, according to an embodiment.

FIG. 5 is a diagram illustrating a portion (a temperature compensator 141b) of a processor of an apparatus for providing a bias current to a hall sensor, according to an embodiment.

Referring to FIG. 5, the temperature compensator 141b may produce a compensating output value TCH by applying the voltage variation rate VTA in accordance with a unit temperature variation as a coefficient of the voltage VLH corresponding to a voltage difference between first and second hall sensor output terminals.

Figure 6:
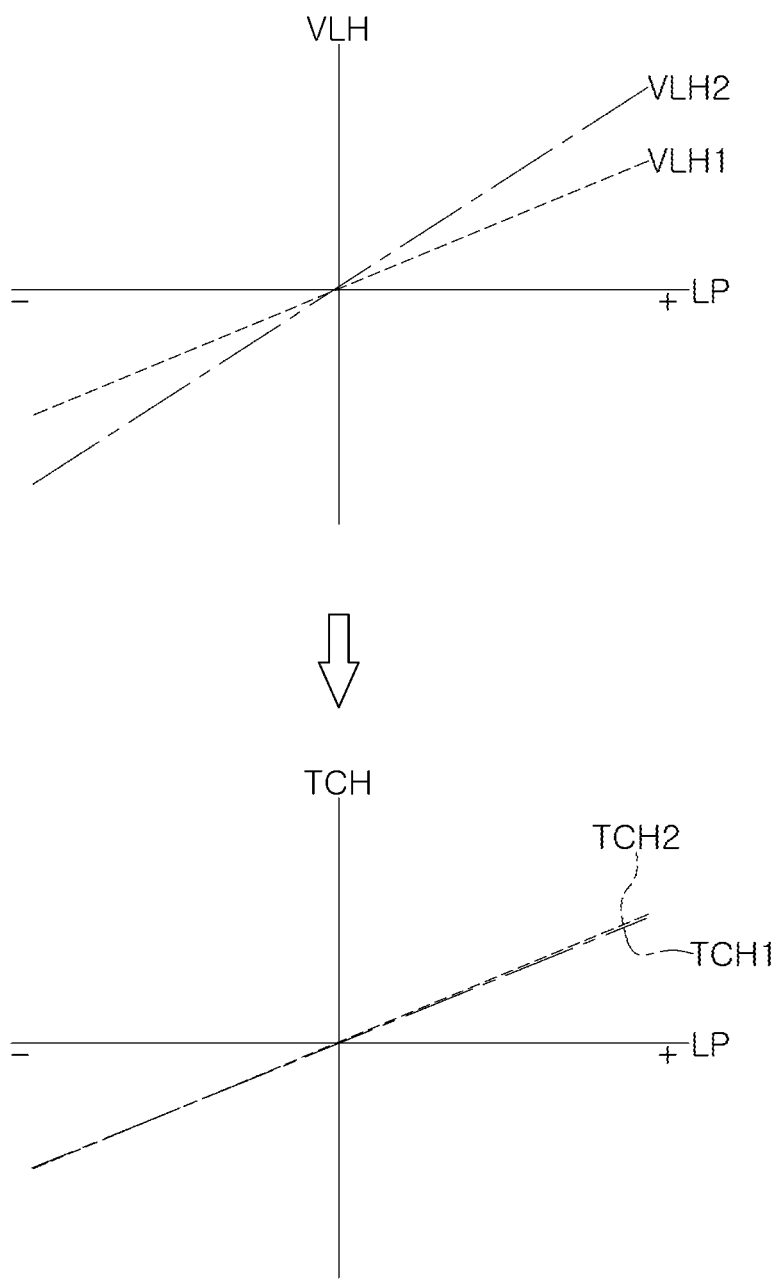
FIG. 6 is a diagram illustrating compensating output values of an apparatus for providing a bias current to a hall sensor, according to an embodiment in accordance with temperature compensation.

FIG. 6 is a diagram illustrating compensating output values of an apparatus for providing a bias current to a hall sensor, according to an embodiment.

Referring to FIG. 6, a slope of a voltage VLH1 before temperature compensation according to magnetic flux LP of a hall sensor at a first temperature, and a voltage VLH2 before temperature compensation according to the magnetic flux LP of the hall sensor at a second temperature may be different.

A slope of a compensating output value TCH1 according to the magnetic flux LP of the hall sensor at the first temperature and a slope of a compensating output value TCH2 according to the magnetic flux LP of the hall sensor at the second temperature may be substantially the same.

Since a change in the slope according to the unit temperature variation of the compensating output value TCH is small, the compensating output value TCH may be less relevant to the hall sensor temperature as compared to the voltage VLH before the temperature compensation, and may be used in extraction of more accurate information of magnetic flux.

Figure 7:
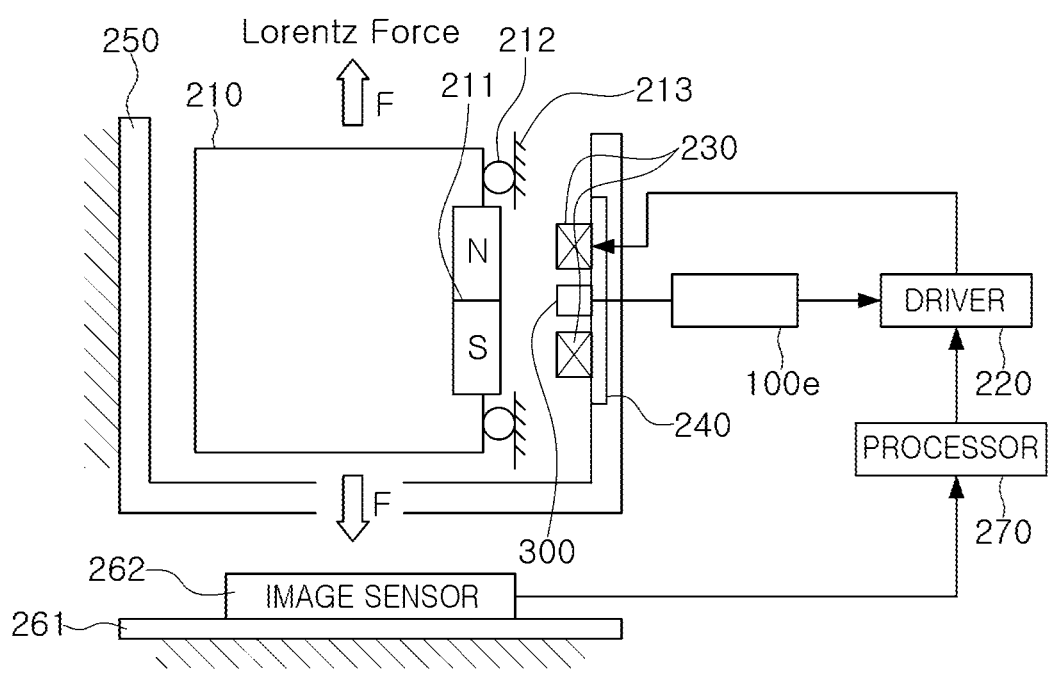
FIG. 7 is a diagram illustrating a structure in which an apparatus for providing a bias current to a hall sensor is included in a lens module controlling structure, according to an example embodiment.
Figure 8:
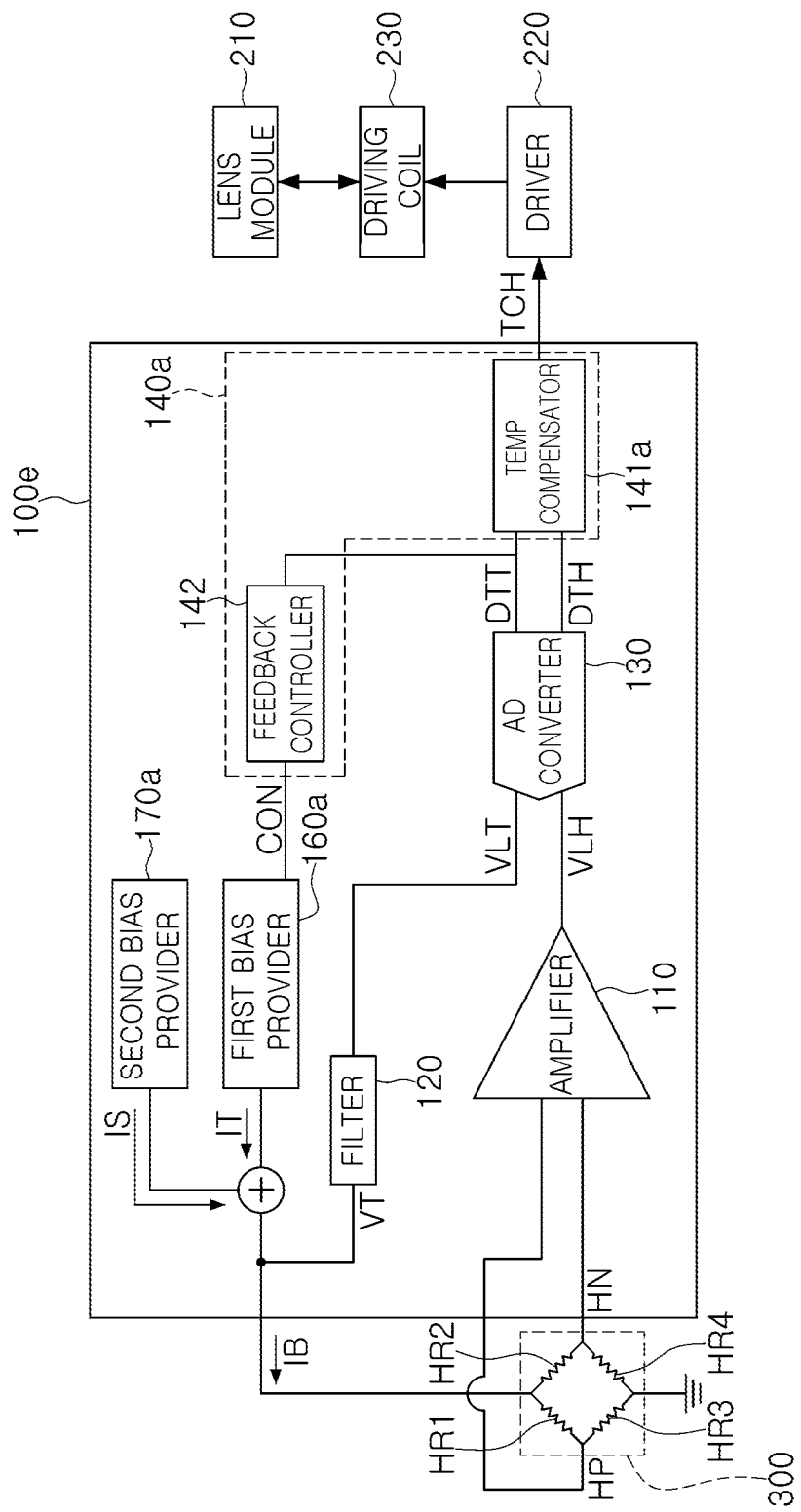
FIG. 8 is a diagram of the apparatus illustrated in FIG. 7, according to an embodiment.

FIG. 7 is a diagram illustrating a structure in which an apparatus 100e for providing a bias current to a hall sensor is included in a lens module controlling structure, according to an embodiment. FIG. 8 is a diagram of the apparatus 100e illustrated in FIG. 7, according to an embodiment.

Referring to FIGS. 7 and 8, the apparatus 100e for providing a bias current to a hall sensor may provide the compensating output value TCH to a driver 220 electrically connected to the hall sensor 300 and configured to control driving of a lens module 210.

In an example in which the processor 140a does not include the temperature compensator 141a, the apparatus 100e may provide the hall sensor output value DTH to the driver 220.

The driver 220 may extract information of magnetic flux passing through the hall sensor 300 from the hall sensor output value DTH or the compensating output value TCH and produce position information of the lens module 210 through the magnetic flux information. For example, the driver 220 may be implemented as an IC additionally implemented for the apparatus 100e.

The driver 220 may include an OIS controlling structure, and may determine a magnitude of a driving current based on the magnetic flux information and output the determined driving current to a driving coil 230.

The driving coil 230 may produce magnetic flux based on the driving current and may be disposed close to a magnetic member 211 of the lens module 210. For example, the driving coil 230 and the hall sensor 300 may be disposed on a first board 240.

The lens module 210 may react to magnetic flux of the driving coil 230 and move in accordance with a force received by the magnetic member 211. In this case, the lens module 210 may move such that the magnetic flux changes in a direction opposite to a direction of a change of the magnetic flux passing through the hall sensor 300. Accordingly, an absolute position of the lens module 210 may be substantially fixed, and an image obtained by the lens module 210 may be stable.

A processor 270 may be separately implemented from the processor 140a of the apparatus 100e. The processor 270 may be an image signal processor (ISP). The processor 270 may receive image information from an image sensor 262 on a first support member 261 and provide processed image information to the driver 220.

The lens module 210 may one-dimensionally or two-dimensionally move in accordance with a rotation of a plurality of guide balls 212, and may be surrounded by a housing 250.

According to an embodiment disclosed herein, an apparatus for providing a bias current to a hall sensor may reduce an effect of elements dependent of a temperature of an output voltage of a hall sensor, without a separate temperature sensor.

According to an embodiment disclosed herein, an apparatus for providing a bias current to a hall sensor may have a structure in which a beginning and an end of a process of reducing an effect of the elements dependent of the temperature of the output voltage of the hall sensor utilize a bias current, and can thus improve at least one of efficiency, accuracy and stability of the process.

The filter 120, the AD converter 130, the processors 140a, 140b, and 270, the temperature compensators 141a and 141b, the feedback controller 142, the first bias provider 160a, the second bias provider 170a, and the driver 220 in FIGS. 1A to 8 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. In addition, respective embodiments may be combined with each other. Therefore, the scope of the disclosure is defined not by the detailed description, but by the claims and their equivalents, and all variations within the scope of the claims and their equivalents are to be construed as being included in the disclosure.

What is claimed is:

1. An apparatus for providing a bias current to a hall sensor, comprising:
    a bias provider configured to provide the bias current to the hall sensor; and
    a processor configured to produce a bias current control value based on a node voltage between the hall sensor and the bias provider,
    wherein the bias provider is configured to vary the bias current to the hall sensor based on the bias current control value,
    wherein the bias provider comprises:
    a first bias provider configured to produce a variable first bias current based on the bias current control value; and
    a second bias provider configured to produce a second bias current less relevant to the bias current control value than the first bias current, and
    wherein the first and second bias currents are provided in the hall sensor together.

2. The apparatus of claim 1, wherein the processor is further configured to provide a hall sensor output value, corresponding to a voltage difference between first and second output terminals of the hall sensor, to a driver configured to control driving of a lens module.

3. The apparatus of claim 1, further comprising an AD converter configured to: convert a first analog value, corresponding to the node voltage between the hall sensor and the bias provider, to a first digital value; and
    convert a second analog value, corresponding to the voltage difference between the first and second output terminals of the hall sensor, to a second digital value.

4. The apparatus of claim 3, further comprising an amplifier configured to amplify the voltage difference between the first and second output terminals of the hall sensor,
    wherein the second analog value corresponds to an amplified voltage produced by the amplifier.

5. The apparatus of claim 1, further comprising:
    an AD converter configured to convert a first analog value corresponding to the node voltage between the hall sensor and the bias provider to a first digital value; and
    a switch configured to switch an electrical connection between the bias provider and a terminal of the AD converter into which the first analog value is input on and off.

6. The apparatus of claim 1, further comprising a filter configured to filter a frequency component having a frequency higher than a cut-off frequency in the node voltage between the hall sensor and the bias provider.

7. The apparatus of claim 1, wherein the first bias provider comprises:
    first and second resistors electrically connected to each other; and
    an intermediate transistor configured to output a current dependent on the first bias current to the first and second resistors,
    wherein the second resistor has a variable resistance value that varies depending on the bias current control value.

8. The apparatus of claim 7, wherein the first bias provider further comprises an operational amplifier configured to be input with a voltage corresponding to the bias current to the hall sensor, output an amplified voltage to the intermediate transistor, and receive feedback from a node between the first and second resistors.

9. The apparatus of claim 8, wherein the first bias provider further comprises a first transistor configured to be input with the amplified voltage output by the operational amplifier and produce the first bias current, and
    wherein the second bias provider comprises a second transistor configured to be input with a reference voltage from a voltage source and produce the second bias current.

10. The apparatus of claim 1, wherein the processor is further configured to receive a hall sensor output value corresponding to a voltage difference of first and second output terminals of the hall sensor, and produce a compensating output value by compensating for the hall sensor output value based on the node voltage between the hall sensor and the bias provider.

11. An apparatus for providing a bias current to a hall sensor, comprising:

a bias provider configured to provide the bias current to the hall sensor; and a processor configured to produce a bias current control value based on a node voltage between the hall sensor and the bias provider, wherein the bias provider is configured to vary the bias current to the hall sensor based on the bias current control value, wherein the bias provider comprises:

a first transistor configured to produce a first bias current; and a second transistor configured to produce a second bias current, wherein the first and second bias currents are provided together to the hall sensor, and wherein the second transistor is configured to be input, from a voltage source, with a voltage varying based on the bias current control value and produce the second bias current based on the varying voltage.

12. An apparatus for providing a bias current to a hall sensor, comprising:

a bias provider configured to provide the bias current to the hall sensor;

an AD converter configured to:

convert a first analog value, corresponding to a node voltage between the hall sensor and the bias provider, to a first digital value; and convert a second analog value, corresponding to a voltage difference between first and second output terminals of the hall sensor, to a second digital value; and a processor configured to compensate for the second digital value based on the first digital value to produce a compensating output value.

13. The apparatus of claim 12, wherein the processor is further configured to apply the first digital value as a coefficient of the second digital value to produce the compensating output value.

14. The apparatus of claim 12, further comprising:

a switch configured to switch an electrical connection between the bias provider and a terminal of the AD converter into which the first analog value is input on and off; and a filter configured to filter a frequency component having a frequency higher than a cut-off frequency in the node voltage between the hall sensor and the bias provider.

15. The apparatus of claim 12, wherein the processor is further configured to provide the compensating output value to a driver configured to control driving of a lens module.

* * * * *